(12) United States Patent
Doi et al.

(10) Patent No.: US 8,257,538 B2
(45) Date of Patent: Sep. 4, 2012

(54) DEVICE TRANSFER METHOD AND DISPLAY APPARATUS

(75) Inventors: Masato Doi, Kanagawa (JP); Katsuhiro Tomoda, Kanagawa (JP); Toshihiko Watanabe, Kanagawa (JP); Toyoharu Oohata, Tokyo (JP)

(73) Assignee: Sony Corporation, Tokyo (JP)

(*) Notice: Subject to any disclaimer, the term of this patent is extended or adjusted under 35 U.S.C. 154(b) by 1075 days.

(21) Appl. No.: 11/467,007

(22) Filed: Aug. 24, 2006

(65) Prior Publication Data

US 2008/0081400 A1 Apr. 3, 2008

Related U.S. Application Data

(63) Continuation of application No. 10/511,699, filed on May 27, 2005.

(30) Foreign Application Priority Data

Mar. 6, 2003 (JP) .................................. 2003-059540

(51) Int. Cl.
*B44C 1/00* (2006.01)
(52) U.S. Cl. ..... 156/241; 156/247; 156/249; 156/306.9; 156/307.1; 156/307.7
(58) Field of Classification Search .................. None
See application file for complete search history.

(56) References Cited

U.S. PATENT DOCUMENTS

| | | | | |
|---|---|---|---|---|
| 4,034,134 A * | 7/1977 | Gregorian et al. | ............... | 428/86 |
| 5,426,342 A * | 6/1995 | Nakamura et al. | ............ | 313/496 |
| 6,613,610 B2 * | 9/2003 | Iwafuchi et al. | ............... | 438/128 |
| 6,872,635 B2 * | 3/2005 | Hayashi et al. | ............... | 438/463 |

FOREIGN PATENT DOCUMENTS

WO WO 02/84631 * 2/2003 .................... 438/463

* cited by examiner

*Primary Examiner* — Linda L Gray
(74) *Attorney, Agent, or Firm* — K&L Gates LLP (57) ABSTRACT

A device transfer method and a display apparatus are provided. A device transfer method and a display apparatus are provided by or in which, in transferring devices arranged on a substrate onto another substrate, it is possible to easily strip the substrate after the transfer of the devices, to lower the possibility of damaging of the substrate, and to additionally transfer devices onto the same substrate after the transfer of the devices. A plurality of devices arranged on a temporary holding substrate are embedded into and held in a pressure sensitive adhesive layer formed on a transfer substrate, and the devices are stripped from the temporary holding substrate. Other devices are further additionally embedded into the pressure sensitive adhesive layer before hardening the pressure sensitive adhesive layer, whereby the devices can be arranged on a transfer substrate having a large area. Besides, where the devices additionally embedded into the pressure sensitive adhesive layer are different in characteristics from the devices embedded in the pressure sensitive adhesive layer in advance, it is possible to easily obtain a display apparatus for multicolor display, a display apparatus having a driving circuit, and the like.

11 Claims, 8 Drawing Sheets

DEVICE TRANSFER METHOD AND DISPLAY APPARATUS

CROSS REFERENCES TO RELATED APPLICATIONS

The present application is a continuation of U.S. patent application Ser. No. 10/511,699 filed on May 27, 2005 which claims priority to Japanese Patent Document No. P2003-059540 filed on Mar. 6, 2003, the disclosure of which is herein incorporated by reference.

BACKGROUND

The present invention relates to a device transfer method and a display apparatus. More particularly, the present invention relates to a device transfer method and a display apparatus by or in which devices can be transferred accurately.

In the case of assembling an image display apparatus by arranging light-emitting devices in a matrix, it has been a general practice to form the devices directly on a substrate as in the cases of liquid crystal displays (LCD) and plasma display panels (PDP) or to arrange singular light-emitting diode (LED) packages as in the case of light-emitting diode displays (LED displays). For example, in such image display apparatuses as LCD and PDP, device separation is not possible, so that the individual devices generally are formed at intervals corresponding to the pixel pitch of the desired image display apparatus, from the beginning of the manufacturing process.

On the other hand, in the case of LED displays, LED chips are taken out after dicing, and are individually connected to external electrodes by bump connection through flip chips or wire bonding, to thereby achieve packaging. In this case, the devices are arranged at the pixel pitch of the image display apparatus before or after the packaging, and the pixel pitch is independent of the pitch of the devices at the time of forming the devices.

Since the LEDs (light-emitting diodes) as light-emitting devices are expensive, the cost of the image display apparatus using the LEDs can be lowered by producing a large number of LED chips from one sheet of wafer. Namely, when the size of the LED chips is changed from the conventional size of about 300 µm square to a size of several tens of micrometers square and the thus reduced LED chips are connected to manufacture an image display apparatus, the cost of the image display apparatus can be lowered.

Meanwhile, in relation to the manufacturing step for manufacturing a desired apparatus by rearranging onto an apparatus substrate a plurality of devices formed on a device formation substrate, there has been practiced a device arranging method in which devices are transferred onto an adhesive layer provided on a device holding substrate for temporarily holding the devices and, thereafter, the devices are transferred onto the apparatus substrate serving as the final destination of arrangement, for arranging the devices.

In transferring the devices from the device holding substrate onto the apparatus substrate, a method of dropping an adhesive onto the devices temporarily fixed on the device holding substrate and, thereafter, adhering the apparatus substrate thereto has been adopted. In this case, the device holding substrate and the apparatus substrate are adhered to each other, and then the device holding substrate and the apparatus substrate are stripped from each other; in this process, it is difficult to strip the device holding substrate and the apparatus substrate from each other, due to the strong adhesion therebetween by the adhesive. Particularly, in the case of lamination of substrates having large areas, it is highly possible that the substrates may be damaged at the time of stripping. Furthermore, since the adhesive layer is hardened (cured) in the condition where the devices are embedded in the adhesive layer, it is difficult to transfer the devices onto the apparatus substrate and thereafter again transfer devices onto the same apparatus substrate.

SUMMARY

The present invention provides in an embodiment a device transfer method and a display apparatus by or in which, in transferring devices arranged on a substrate onto another substrate, it is possible to easily strip the substrate after the transfer of the devices, to lower the possibility of damaging of the substrates, and to retransfer additional devices onto the same substrate after the transfer of the devices.

According to an embodiment of the present invention, there is provided a device transfer method. The method includes embedding devices arranged on a first substrate into a pressure sensitive adhesive layer provided on a second substrate; and stripping the devices from the first substrate so as to hold the devices in the state of being embedded in the pressure sensitive adhesive layer.

Since the arrangement of the devices relative to the second substrate is held by embedding the devices in the pressure sensitive adhesive layer, it is possible to embed the devices into the pressure sensitive adhesive layer and thereby mount the devices onto the second substrate independently of the shape of the devices. In addition, since the plurality of devices arranged on the first substrate can be collectively embedded into the pressure sensitive adhesive layer by bringing the first substrate and the second substrate closer to each other, it is possible to simultaneously mount the plurality of devices onto the second substrate while maintaining the mutual arrangement conditions of the devices on the first substrate. Since the devices are stripped from a temporary adhesion layer before the pressure sensitive adhesive layer is hardened, the force required for separating the first substrate and the second substrate away from each other is reduced, so that the possibility of damaging the first substrate or the second substrate can be lowered.

In addition, where the pressure sensitive adhesive layer is hardened after the devices are held embedded in the pressure sensitive adhesive layer, it is possible to further embed devices into the pressure sensitive adhesive layer in the condition where the devices are embedded before hardening of the pressure sensitive adhesive layer. Besides, where first electric wirings are formed on the pressure sensitive adhesive layer after hardening of the pressure sensitive adhesive layer, a third substrate is adhered onto the side on which the first electric wirings are formed of the pressure sensitive adhesive layer, the second substrate and the pressure sensitive adhesive layer are stripped from each other, the pressure sensitive adhesive layer is provided with openings reaching the devices, the openings are filled with a conductive material and second electric wirings are formed on the pressure sensitive adhesive layer, it is possible to connect the electric wirings to the devices while maintaining the arrangement of the devices, and to easily use the device transfer method of the present invention for, for example, manufacturing a display apparatus or an electronic apparatus.

In addition, where the devices are brought into contact with a temporary adhesion layer provided on a first substrate to temporarily adhere the devices to the temporary adhesion layer and thereby to arrange the devices on the first substrate, before embedding the devices into the pressure sensitive adhesive layer, it is possible to rearrange the devices a desired number of times in arranging the devices on the first substrate, so that it is possible to transfer the devices after the devices are arranged without any disorder.

Where the tack of the pressure sensitive adhesive layer provided on the second substrate is greater than the tack of the temporary adhesion layer provided on the first substrate or where the tack of the pressure sensitive adhesive layer or the temporary adhesion layer is changed so that the tack of the pressure sensitive adhesive layer will be greater than the tack of the temporary adhesion layer, it is possible to strip the devices from the temporary adhesion layer in the condition where the devices are embedded in the pressure sensitive adhesive layer by only embedding the devices into the pressure sensitive adhesive layer and separating the first substrate and the second substrate away from each other, due to the difference in tack between the pressure sensitive adhesive layer and the temporary adhesion layer, and to simplify or facilitate the working step.

Furthermore, where the embedding into the pressure sensitive adhesive layer is carried out to such a degree that the devices are partly embedded, direct contact of the pressure sensitive adhesive layer and the temporary adhesion layer can be obviated, the force required for separating the first substrate and the second substrate from each other can be reduced, and the possibility of damaging of the first substrate or the second substrate can be lowered. In addition, where the pressure sensitive adhesive layer is formed of an insulating material, the pressure sensitive adhesive layer can be used as it is as an insulation layer by not removing the pressure sensitive adhesive layer after the transfer of the devices is finished, and the number of steps for manufacturing an electronic apparatus or the like can be reduced.

In addition, according to an embodiment of the present invention, there is provided a device transfer method. The method includes further embedding other-side devices arranged on a first substrate into a pressure sensitive adhesive layer provided on a second substrate in the condition where one-side devices are embedded in the pressure sensitive adhesive layer; and stripping the other-side devices from the first substrate so as to hold the other-side devices in the state of being embedded in the pressure sensitive adhesive layer.

By further embedding the other-side devices into the pressure sensitive adhesive layer in the condition where the one-side devices are embedded in the pressure sensitive adhesive layer, it is possible to enlarge the second substrate even in the case where the first substrate is small in area and to transfer a number of times the devices arranged on the first substrate onto the second substrate, so that it is possible to use the device transfer method of the present invention even in the case of manufacturing a display apparatus having a large surface area.

In this case, where the one-side devices and the other-side devices have different characteristics, it is possible to arrange and hold on the second substrate those devices which cannot be formed on the same growth substrate. In this case, where light-emitting diodes for emitting light in different colors such as red, green and blue are arranged on the second substrate as the devices differing in characteristics, it is also possible to obtain a display apparatus for multicolor display. In addition, where the one-side devices and the other-side devices are held in the embedded state in different areas on the substrate, it is possible, even in the case where the area permitting the arrangement of the devices on the first substrate is limited, to enlarge the area of the second substrate, to additionally embed devices into the area where the devices have not yet been embedded of the pressure sensitive adhesive layer, and thereby to arrange the devices onto a substrate which is large in area. This provides a device transfer method in an embodiment which is particularly useful in the case of manufacturing a display apparatus having a large screen Besides, according to an embodiment of the present invention, there is provided a display apparatus obtained by a method including embedding devices arranged on a first substrate into a pressure sensitive adhesive layer provided on a second substrate; stripping the devices from the first substrate so as to hold the devices in the state of being embedded in the pressure sensitive adhesive layer, and hardening the pressure sensitive adhesive layer in this condition; forming first electric wirings on the pressure sensitive adhesive layer, adhering a third substrate onto the side on which the first electric wirings are formed of the pressure sensitive adhesive layer, and stripping the second substrate and the pressure sensitive adhesive layer from each other; and providing the pressure sensitive adhesive layer with openings reaching the devices, filling the openings with a conductive material, and forming second electric wirings on the pressure sensitive adhesive layer.

By obtaining the display apparatus by the device transfer method in an embodiment that includes embedding the devices into the pressure sensitive adhesive layer, it is possible to favorably carry out the arrangement of the devices and the formation of the electric wirings. Where display is carried out through simple matrix driving by impressing a voltage on the devices through the first electric wirings and the second electric wirings, it is possible to display images in the same manner as in the case of an existing simple matrix driving type display apparatus.

In addition, according to an embodiment of the present invention, there is provided a display apparatus obtained by a method that includes embedding one-side devices arranged on a first substrate into a pressure sensitive adhesive layer provided on a second substrate, and stripping the one-side devices from the first substrate so as to hold the one-side devices in the state of being embedded in the pressure sensitive adhesive layer; further embedding other-side devices arranged on the first substrate into the pressure sensitive adhesive layer, and stripping the other-side devices from the first substrate so as to hold the other-side devices in the state of being embedded in the pressure sensitive adhesive layer, in the condition where the one-side devices are embedded in the pressure sensitive adhesive layer; hardening the pressure sensitive adhesive layer in the condition where the one-side devices and the other-side devices are held in the state of being embedded in the pressure sensitive adhesive layer; forming first electric wirings on the pressure sensitive adhesive layer, adhering a third substrate onto the side on which the first electric wirings are formed of the pressure sensitive layer, and stripping the second substrate and the pressure sensitive adhesive layer from each other; and providing the pressure sensitive adhesive layer with openings reaching the one-side devices or the other-side devices, filling the openings with a conductive material, and forming second electric wirings on the pressure sensitive adhesive layer.

By obtaining the display apparatus by the device transfer method in an embodiment that includes embedding the devices in the pressure sensitive adhesive layer, it is possible to carry out the arrangement of the devices and the formation of the electric wirings. With the other-side devices further embedded into the pressure sensitive adhesive layer in the condition where the one-side devices are embedded in the pressure sensitive adhesive layer, it is possible to enlarge the second substrate and, hence, to obtain a display apparatus having a large display area.

In this case, where the one-side devices and the other-side devices have different characteristics, it is possible to arrange and hold on the second substrate those devices which cannot be formed on the same growth substrate. Where light-emitting diodes for emitting light in different colors are arranged, it is also possible to obtain a display apparatus for multicolor display. In addition, where the one-side devices and the other-side devices are held in the embedded state in different areas on the substrate, it is possible, even in the case where the area permitting the arrangement of the devices on the first substrate is limited, to enlarge the area of the second substrate, to additionally embed devices into the area where the devices have not yet been embedded of the pressure sensitive adhesive layer, and thereby to arrange the devices on a substrate having a large area.

Where display is carried out through simple matrix driving by impressing a voltage on the devices through the first electric wirings and the second electric wirings, it is possible to display images in the same manner as in the case of an existing simple matrix driving type display apparatus. In addition, where the one-side devices or the other-side devices are display devices or driving circuit devices and display is carried out through active matrix driving by impressing a voltage on the display devices by the driving circuit devices, it is possible to display images in the same manner as in the case of an existing active matrix driving type display apparatus.

Additional features and advantages are described herein, and will be apparent from, the following Detailed Description and the figures.

DETAILED DESCRIPTION

The present invention relates to a device transfer method and a display apparatus. More particularly, the present invention relates to a device transfer method and a display apparatus by or in which devices can be transferred accurately.

The device transfer method and the display apparatus according to various embodiments of the present invention will be described in detail below, referring to the drawings Where it should be appreciated that the present invention is not limited to the following description, and modifications can be appropriately made without departure from the scope of the gist of the invention.

Figure 1:
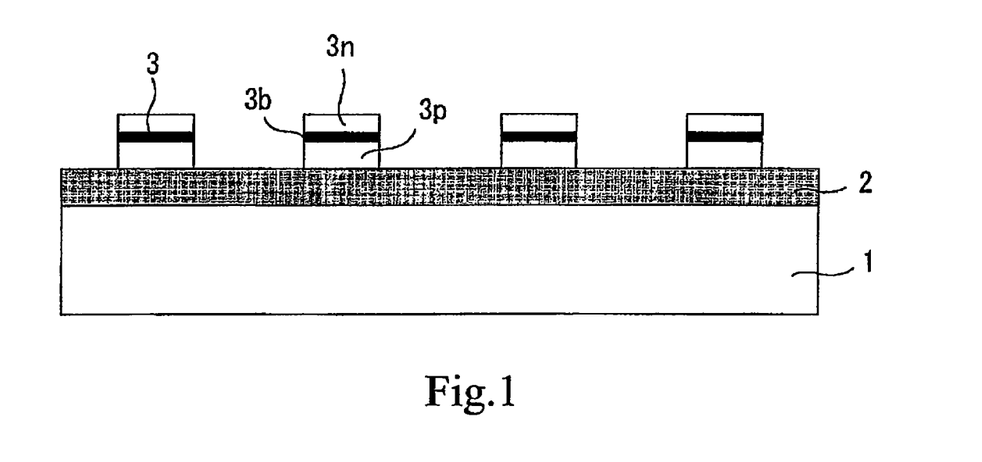
FIG. 1 is a sectional view showing a device transfer method, illustrating the manner in which devices have been arranged on a temporary holding substrate pursuant to an embodiment of the present invention.

As shown in FIG. 1, a temporary adhesion layer 2 is formed on a temporary holding substrate 1, and devices 3 which are light-emitting diodes are arranged on the temporary adhesion layer 2. The temporary holding substrate 1 is a substrate having a desired rigidity, and various substrates such as semiconductor substrates, quartz glass substrates, plastic substrates, and metallic substrates can be used as the temporary holding substrate 1. The temporary adhesion layer 2 is formed of a material having a tack with which the devices 3 can be held to such a degree that the positions of the devices 3 on the temporary holding substrate 1 are not changed at the time of handling the temporary holding substrate 1. In addition, the temporary adhesion layer 2 is composed, for example, of a silicone resin layer, and may be formed by adhesion of a sheet form adhesive layer or by applying an adhesive layer by spin coating or the like.

The device 3 is a light-emitting diode composed of a material based on a nitride semiconductor such as gallium nitride, which has, for example, a double hetero structure in which an active layer $3b$ is sandwiched between a p-clad layer $3p$ and an n-clad layer $3n$. In addition, the device 3 shown here is roughly flat plate-like in shape, and is formed by a method in which the active layer and the clad layers of the device 3 are extended in planes parallel to the principal surface of a sapphire substrate on which to grow the active layer and the clad layers, and a gallium nitride crystal layer or the like is laminated by selective growth or the like. While an example in which the p-clad layer 3*p* is present on the temporary adhesion layer 2 side of the device 3 is shown in the figure, the device 3 may be so disposed that the n-clad layer 3*n* is located on the side of the temporary adhesion layer 2. Besides, though omitted in the figure, a p-electrode for lowering the contact resistance between the electric wiring which will be described later and the device 3 is formed on the surface of the p-clad layer 3*p*, and, similarly, an n-electrode is formed on the surface of the n-clad layer 3*n*.

In addition, the device 3 may not necessarily have the double hetero structure or be a light-emitting diode, and may be an electronic circuit device processed in a minute size. The shape of the device 3 may not necessarily be the roughly flat plate-like shape, and may be any of various shapes such as a hexagonal pyramidal shape; for efficient holding of the device 3 in close contact with the temporary adhesion layer 2, however, it is desirable that the surface, for contact with the temporary adhesion layer 2, of the device 3 is flat. Besides, while the devices 3 are shown to be arranged on the temporary adhesion layer 2 at a regular internal in the figure, the devices 3 may not necessarily be arranged at a regular interval.

The devices 3 are arranged on the temporary adhesion layer 2 in a matrix, i.e., the devices 3 are arranged in plurality in both a column direction and a row direction in a plane, so that a plurality of the devices 3 are arranged at a regular interval also in the direction orthogonal to the paper surface in the figure. Since the devices 3 are light-emitting diodes which function as display devices, the devices 3 arranged in a matrix can display images when driven by simple matrix driving.

Figure 2:
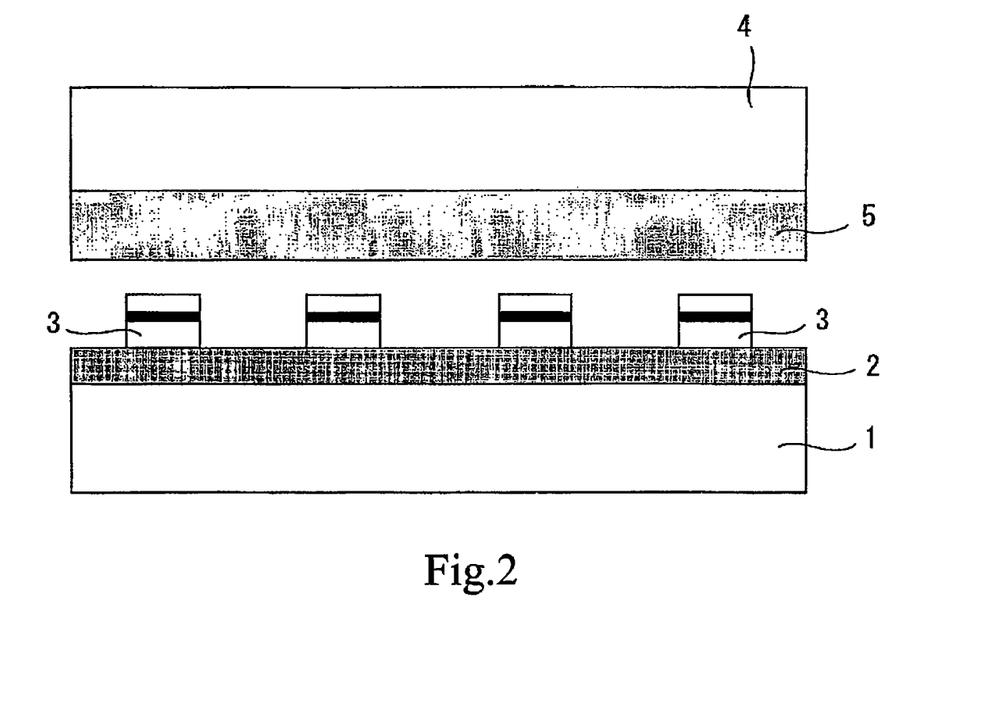
FIG. 2 is a step sectional view showing the manner in which a transfer substrate provided thereon with a pressure sensitive adhesive layer has been disposed in parallel to the temporary holding substrate pursuant to an embodiment of the present invention.

Next, as shown in FIG. 2, a transfer substrate 4 provided thereon with a pressure sensitive adhesive layer 5 is disposed in parallel to the temporary holding substrate 1. As the transfer substrate 4, various substrates such as semiconductor substrates, quartz glass substrates, plastic substrates, and metallic substrates can be used. The pressure sensitive adhesive layer 5 is formed of a plastic resin capable of being hardened (cured) by an external cause such as a heat treatment, and is formed by applying the resin by spin coating or the like. The pressure sensitive adhesive layer 5 has such a thickness that the devices 3 can be embedded, for example, entirely, in the pressure sensitive adhesive layer 5. In addition, for utilizing the pressure sensitive adhesive layer 5, instead of removing it in the subsequent step, as an insulation layer of a display apparatus, it is desirable to use an insulating material in forming the pressure sensitive adhesive layer 5.

Figure 3:
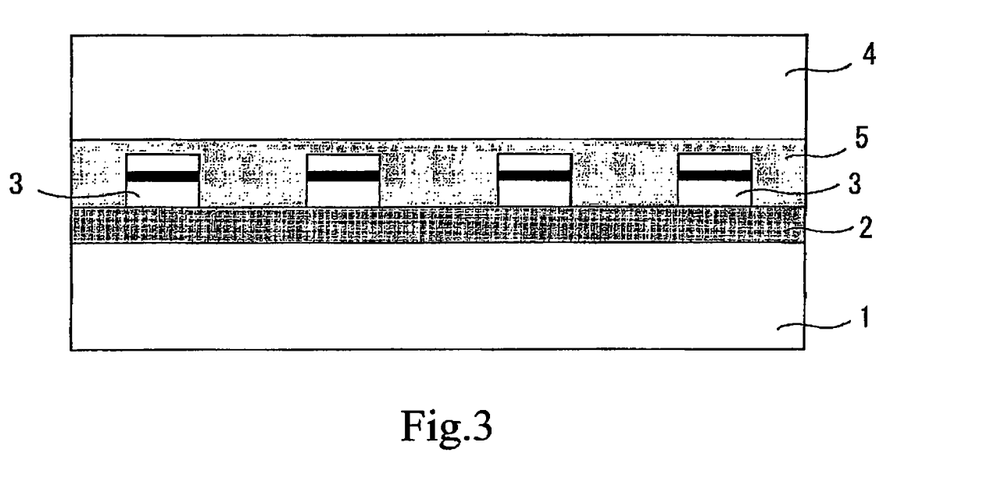
FIG. 3 is a step sectional view showing the manner in which the temporary holding substrate and the transfer substrate have been brought close to each other to embed devices into the pressure sensitive adhesive layer pursuant to an embodiment of the present invention.

Subsequently, as shown in FIG. 3, the transfer substrate 4 and the temporary holding substrate 1 are brought closer to each other while maintaining the parallelism, whereby the devices 3 held on the temporary holding substrate 2 are embedded into the pressure sensitive adhesive layer 5. In this case, as shown in FIG. 3, the devices 3 are embedded into the pressure sensitive adhesive layer 5 until the temporary adhesion layer 2 comes into contact with the pressure sensitive adhesive layer 5 so that the surfaces, making contact with the temporary adhesion layer 2, of the devices 3 come to be substantially flush with the surface of the pressure sensitive adhesive layer 5.

Since the arrangement of the devices 3 relative to the transfer substrate 4 is held by embedding the devices 3 in the pressure sensitive adhesive layer 5, it is possible to embed the devices 3 in the pressure sensitive adhesive layer 5 and, hence, to mount the devices 3 onto the transfer substrate 4, independently of the shape of the devices 3. In addition, since the plurality of the devices 3 arranged on the temporary adhesion layer 2 can be collectively embedded into the pressure sensitive adhesive layer 5 by bringing the temporary holding substrate 1 and the transfer substrate 4 closer to each other, the plurality of the devices 3 can be simultaneously mounted onto the transfer substrate 4 while maintaining the mutual arrangement conditions of the devices 3 on the temporary adhesion layer 2.

Figure 4:
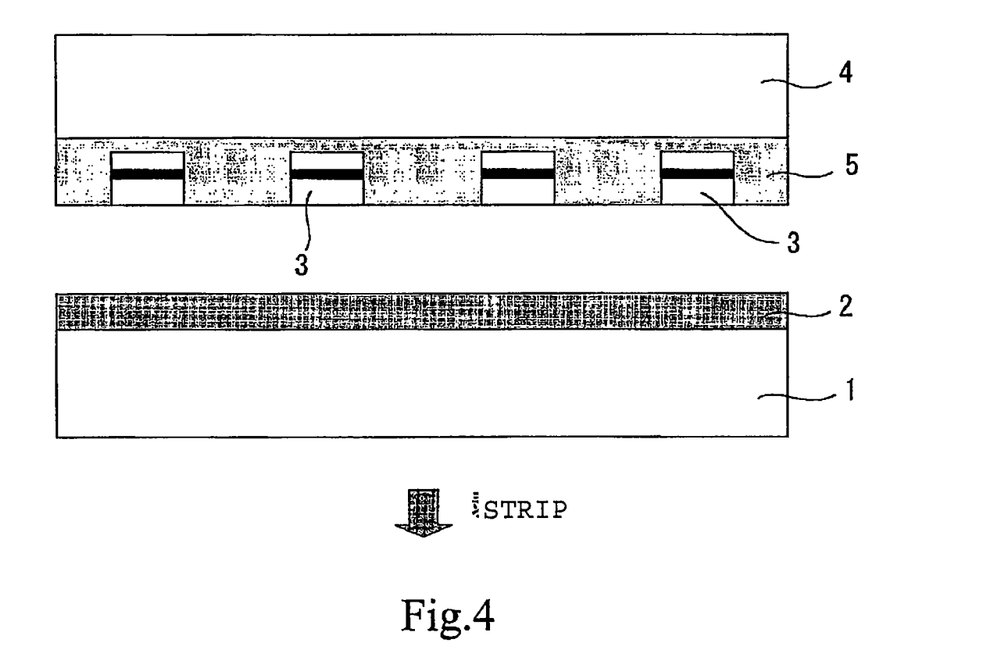
FIG. 4 is a step sectional view showing the manner in which the devices are stripped from the temporary holding substrate and the devices are held in the state of being embedded in the pressure sensitive adhesive layer pursuant to an embodiment of the present invention.

Next, as shown in FIG. 4, the devices 3 are stripped from the temporary adhesion layer 2 so as to hold the positions of the devices 3 on the transfer substrate 4, with the devices 3 embedded in the pressure sensitive adhesive layer 5. In this case, where the materials for constituting the pressure sensitive adhesive layer 5 and the temporary adhesion layer 2 are so selected that the tack of the pressure sensitive adhesive layer 5 for holding the embedded devices 3 is greater than the tack of the temporary adhesion layer 3 for holding the devices 3, it is possible, by simply separating the temporary holding substrate 1 and the transfer substrate 4 away from each other, to strip the devices 3 from the temporary adhesion layer 2 and to hold the devices 3 in the state of being embedded in the pressure sensitive adhesive layer 5. Also, a method may be adopted in which the material for constituting the temporary adhesion layer 2 or the pressure sensitive adhesive layer 5 is so selected that the tack thereof is changed by an environmental change such as heating or irradiation with light and, after the embedding of the devices 3 into the pressure sensitive adhesive layer 5, an environmental change is caused so that the tack of the pressure sensitive adhesive layer 5 will be greater than the tack of the temporary adhesion layer 2.

Since the devices 3 are stripped from the temporary adhesion layer 2 before hardening (curing) the pressure sensitive adhesive layer 5, the force required for separating the temporary holding substrate 1 and the transfer substrate 4 away from each other is reduced, and the possibility that the temporary holding substrate 1 or the transfer substrate 4 may be damaged at the time of stripping the devices 3 from the temporary adhesion layer 2 is lowered. Particularly, in the case of manufacturing a display apparatus having a large screen, it is necessary to enlarge the area of the transfer substrate 4, so that the lowering in the possibility of damaging of the transfer substrate 4 or the temporary holding substrate 1 promises a reduction in the manufacturing cost.

Figure 5:
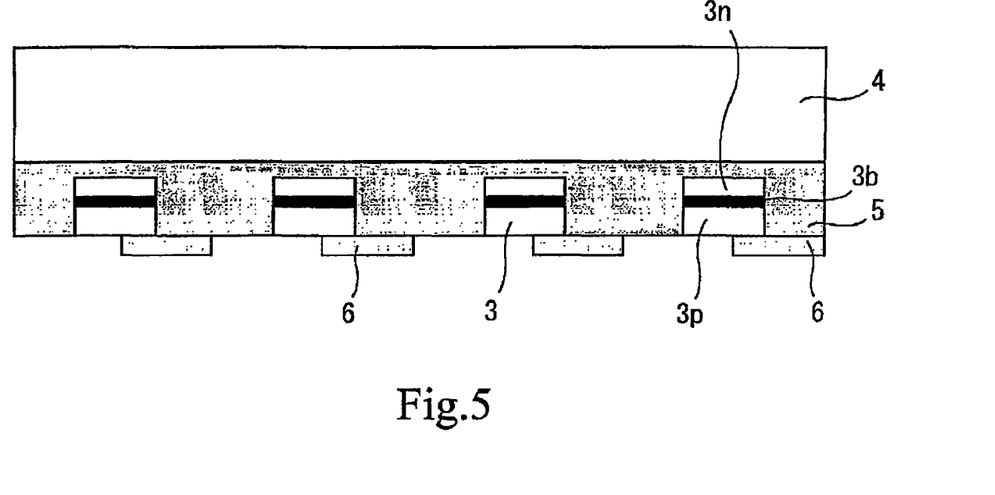
FIG. 5 is a step sectional view showing the manner in which electric wirings have been formed on the pressure sensitive adhesive layer pursuant to an embodiment of the present invention.

Subsequently, as shown in FIG. 5, in the condition where the devices 3 are held embedded in the pressure sensitive adhesive layer 5, an external cause for hardening (curing) the pressure sensitive adhesive layer 5, for example, a heating treatment or the like is applied, to harden (cure) the pressure sensitive adhesive layer 5, and electric wirings 6 are formed on the pressure sensitive adhesive layer 5 and the devices 3. Since the devices 3 and the pressure sensitive adhesive layer 5 are flush with each other, the electric wirings 6 can be formed by an ordinarily used method, such as a method of providing a mask on the pressure sensitive adhesive layer 5 and sputtering a metal, and a method of forming a metallic layer on the devices 3 and the pressure sensitive adhesive layer 5 and then carrying out photolithography and etching. Since the exposed surface of each of the devices 3 is the p-electrode formed on the p-clad layer 3*p*, the electric wiring 6 is in connection with the p-clad layer 3*p* of the device 3. Besides, the electric wirings 6 are formed in stripes extending in the direction orthogonal to the paper surface in the figure, and function as scan lines for the devices 3 arranged in a matrix.

Figure 6:
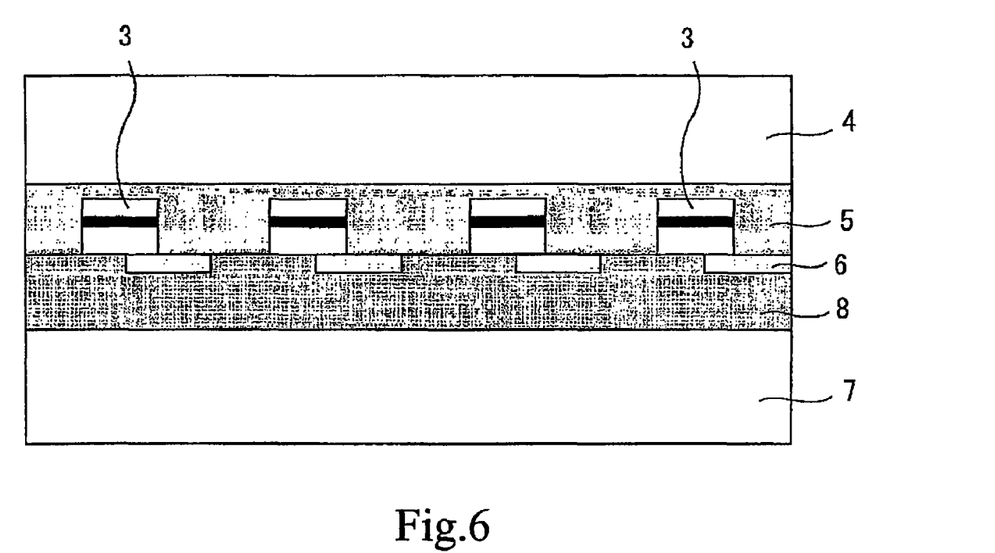
FIG. 6 is a step sectional view showing the manner in which a support substrate provided thereon with an adhesive layer has been adhered to the devices and the electric wirings pursuant to an embodiment of the present invention.
Figure 7:
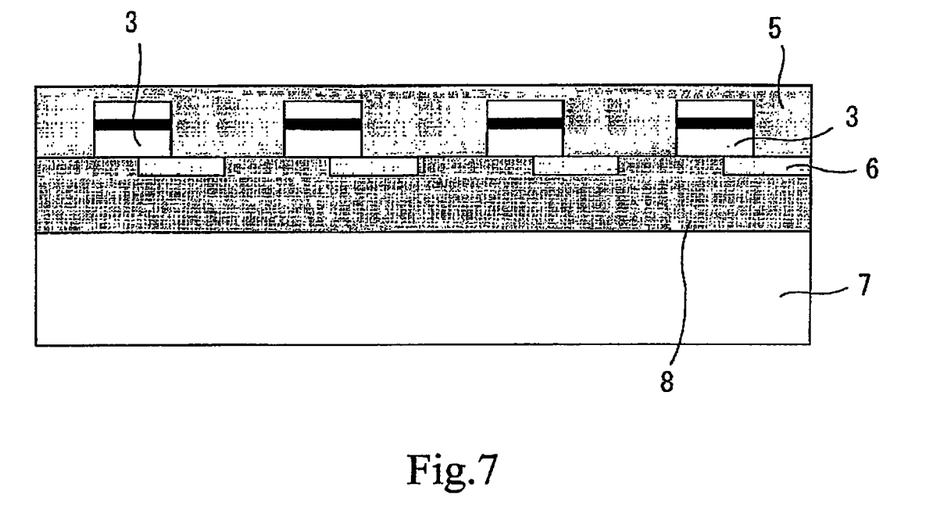
FIG. 7 is a step sectional view showing the condition where the pressure sensitive adhesive layer and the transfer substrate have been stripped pursuant to an embodiment of the present invention.

Next, as shown in FIG. 6, a support substrate 7 provided thereon with an adhesive layer 8 is adhered to the pressure sensitive adhesive layer 5 so that the surface, provided thereon with the electric wirings 6, of the pressure sensitive layer 5 makes contact with the adhesive layer 8. In this case, since the plurality of electric wirings 6 formed on the pressure sensitive adhesive layer 5 make contact with the adhesive layer 8, an insulating material is selected for forming the adhesive layer 8. After adhesion of the support substrate 7, irradiation with laser is conducted, as shown in FIG. 7, to strip the transfer substrate 4 from the pressure sensitive adhesive layer 5. By the stripping of the transfer substrate 4 and the pressure sensitive adhesive layer 5 from each other, as shown in the figure, a condition is obtained in which the adhesive layer 8 is formed on the support substrate 7, the hardened (cured) pressure sensitive adhesive layer 5 is laminated on the adhesive layer 8, and the electric wirings 6 formed on the adhesive layer 8 and the plurality of the devices 3 embedded in the pressure sensitive adhesive layer 5 are held between the adhesive layer 8 and the pressure sensitive adhesive layer 5. In this case, since the devices 3 are not exposed from the hardened pressure sensitive adhesive layer 5, formation of electric wirings in contact with the n-clad layers 3 of the devices 3 cannot be performed.

Figure 8:
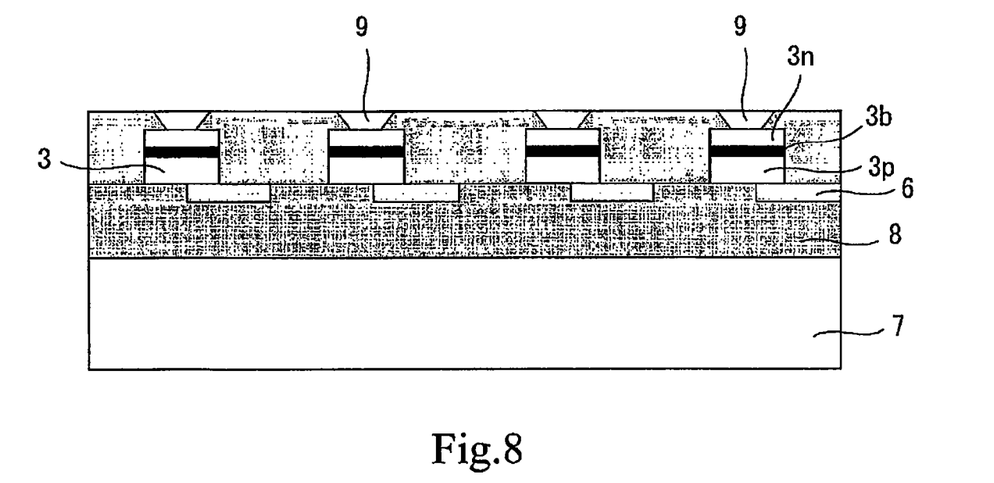
FIG. 8 is a step sectional view showing the condition where contact vias have been opened in the pressure sensitive adhesive layer pursuant to an embodiment of the present invention.

In view of this, as shown in FIG. 8, the hardened pressure sensitive adhesive layer 5 is provided with contact vias 9, which are openings reaching the n-clad layers 3n of the devices 3, by dry etching or the like. With the contact vias 9 thus opened in the pressure sensitive adhesive layer 5, the n-clad layers 3n of the devices 3 are exposed from the pressure sensitive adhesive layer 5, so that the formation of the electric wirings therefor can be performed.

Figure 9:
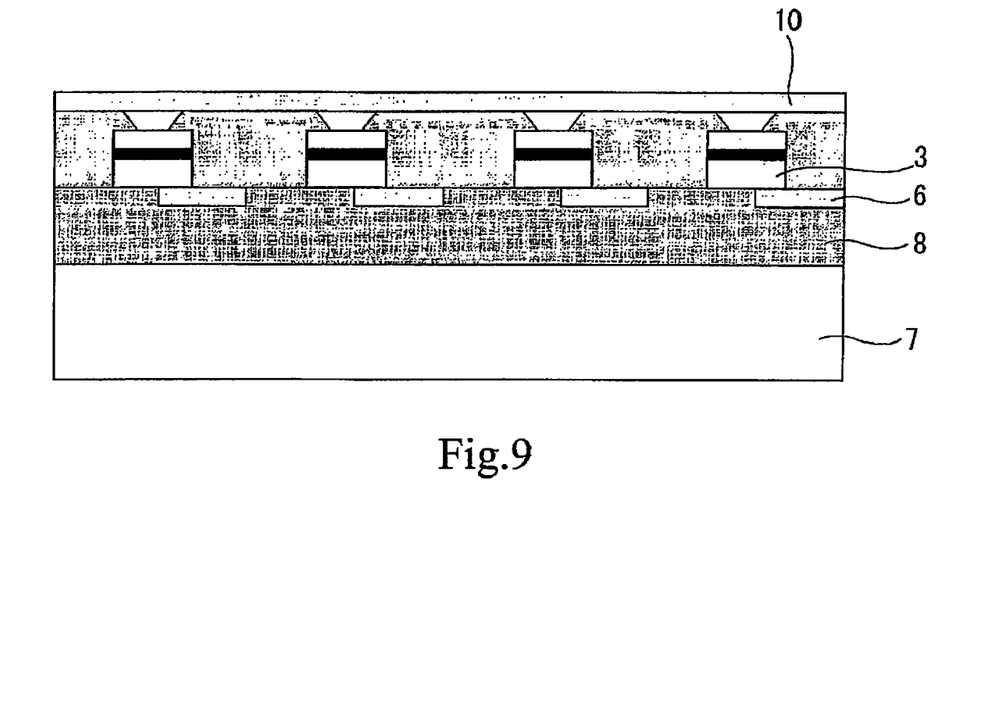
FIG. 9 is a sectional view showing the condition where a metal has been layered on the pressure sensitive adhesive layer to fill up the contact vias and electric wirings have been formed pursuant to an embodiment of the present invention.

Subsequently, as shown in FIG. 9, the contact vias 9 are filled with a metal, and electric wirings 10 are formed on the pressure sensitive adhesive layer 5. The electric wirings 10 can be formed by an ordinarily used method, such as a method of providing a mask on the pressure sensitive adhesive layer 5 and sputtering a metal, and a method of forming a metallic layer on the devices 3 and the pressure sensitive adhesive layer 5 and then performing photolithography and etching. Since the surface of each of the devices 3 exposed from the contact vias 9 is the n-electrode formed on the n-clad layer 3n, the electric wiring 10 is in contact with the n-clad layer 3n of the device 3. In addition, the electric wirings 10 are formed in stripes extending in the direction parallel to the paper surface in the figure, and function as signal lines for the devices 3 arranged in a matrix.

With the transfer of the devices 3 and the formation of the electric wirings 6 and the electric wirings 10 performed by the above-described method, an arrangement of the devices 3 is obtained in which the adhesive layer 8 is formed on the support substrate 7, the hardened pressure sensitive adhesive layer 5 is laminated on the adhesive layer 8, the electric wirings 6 formed on the adhesive layer 8 and the plurality of the devices 3 embedded in the pressure sensitive adhesive layer 5 are held between the adhesive layer 8 and the pressure sensitive adhesive layer 5, the contact vias 9 formed in the pressure sensitive adhesive layer 5 are filled with the metal, and the electric wirings 10 are formed on the pressure sensitive adhesive layer 5. The devices 3 arranged in a matrix on the support substrate 7 are light-emitting diodes, the electric wirings 6 are scan lines in stripes in connection with the p-clad layers 3p of the devices 3, and the electric wirings 10 are signal lines in stripes in connection with the n-clad layers 3n of the devices 3; therefore, with the arrangement of the devices shown in FIG. 9, it is possible to obtain a display apparatus capable of displaying images when driven by simple matrix driving.

In the device transfer method according to an embodiment of the present invention, one example of the method of arranging the devices 3 on the temporary adhesion layer 2 provided on the temporary holding substrate 1 so as to obtain the condition shown in FIG. 1 will be described below.

The devices 3 are configured as light-emitting diodes which are each formed from a material based on a nitride semiconductor such as gallium nitride and which are arranged in a matrix on a sapphire substrate. The device 3 is formed by a method in which an active layer and clad layers of the device are extended in planes parallel to the principal surface of the sapphire substrate on which to grow the active layer and the clad layers, and a gallium nitride crystal layer or the like is laminated by selective growth or the like.

The devices 3 are formed on the sapphire substrate in the state of being separated one by one; the devices 3 can be separated individually, for example, by RIE (Reactive Ion Etching) or the like. While the device 3 has a roughly flat plate-like shape in this example, there may be adopted a device which has an inclined crystal layer inclined against the principal surface of the sapphire substrate. Where the device 3 is, for example, a device composed of an active layer and clad layers having crystal surfaces parallel to planes inclined against the principal surface of the sapphire substrate, the devices can also be transferred in the form of chips obtained by covering the devices with a resin.

Subsequently, in the condition where the devices 3 are adhered to the temporary adhesion layer 2, the devices 3 are separated from the sapphire substrate. In separating the devices 3 from the sapphire substrate, irradiation with beams of laser such as excimer laser and YAG laser is conducted from the back side of the sapphire layer, to cause laser ablation at the interface between the devices 3 and the sapphire substrate. The laser ablation means the phenomenon in which a fixed material absorbing the irradiation beams is photochemically or thermally excited and the bonds in the atoms or molecules at the surface or in the inside thereof are broken; the laser ablation appears primarily as a phenomenon in which a part or the whole part of the fixed material undergoes a phase change such as melting, evaporation, and gasification. The laser ablation causes decomposition of the GaN-based material into metallic Ga and nitrogen, resulting in gas generation, at the interface between the devices 3 and the sapphire substrate. This enables a comparatively easy stripping of the devices 3. As the laser beams for irradiation, excimer laser is preferably used in view of its high output in the shorter wavelength region, particularly. The use of excimer laser enables an instantaneous process and swift stripping of the devices 3.

With the devices 3 stripped from the sapphire substrate serving as the growth substrate and arranged on the temporary holding substrate 1 by use of the above-mentioned laser ablation, even the devices 3 arranged extremely close to each other on the growth substrate can be arranged on the temporary holding substrate 1 at an enlarged interval, by selectively irradiating the devices 3 with laser beams and stripping the irradiated devices from the growth substrate.

With the display apparatus obtained by use of the device transfer method in which the devices 3 are embedded in the pressure sensitive adhesive layer 5, it is possible to carry out the arrangement of the devices 3 and the formation of the electric wirings 6 and the electric wirings 10. Where display is conducted through simple matrix driving by impressing a voltage on the devices 3 through the electric wirings 6 and the electric wirings 10, it is possible to display images in the same manner as in the case of an existing simple matrix driving type display apparatus.

Next, another embodiment of the present invention will be described below referring to the drawings. This embodiment is a device transfer method different from the above-described first embodiment described above in that the step of embedding the devices into the pressure sensitive adhesive layer is changed. The other steps are the same as in the first embodiment and, therefore, description thereof is omitted.

Figure 10:
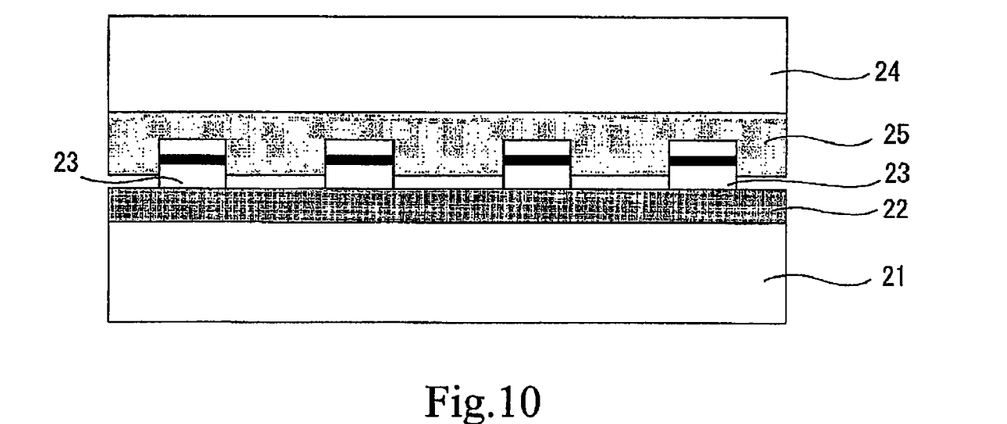
FIG. 10 is a step sectional view showing the condition where the temporary holding substrate and the transfer substrate have been brought close to each other to such a degree as to partly embed the devices into the pressure sensitive adhesive layer, in an embodiment of the present invention.

Devices 23 are arranged on a temporary adhesion layer 22 provided on a temporary holding substrate 21, a transfer substrate 24 provided thereon with a pressure sensitive adhesive layer 25 is disposed in parallel to the temporary holding substrate 21, and then the temporary holding substrate 21 and the transfer substrate 24 are brought closer to each other. In the first embodiment, the temporary holding substrate and the transfer substrate have been brought closer to each other until the temporary adhesion layer makes contact with the pressure sensitive adhesive layer, thereby embedding the devices into the pressure sensitive adhesive layer to such a degree that the surfaces of the devices and the pressure sensitive adhesive layers become flush with each other. In this embodiment, as shown in FIG. 10, the temporary holding substrate 21 and the transfer substrate 24 are brought closer to each other until a condition is obtained in which the temporary adhesion layer 22 and the pressure sensitive adhesive layer 25 do not make contact with each other and in which the devices 23 are partly embedded in the pressure sensitive adhesive layer 25.

Figure 11:
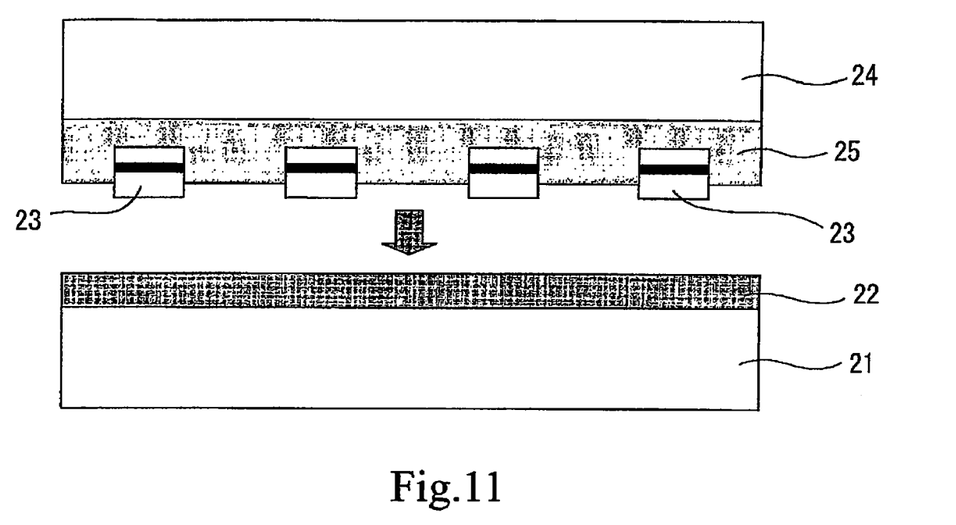
FIG. 11 is a step sectional view showing the manner in which the devices have been stripped from the temporary holding substrate in the condition where the devices are partly embedded in the pressure sensitive adhesive layer pursuant to an embodiment of the present invention.

After the devices 23 are partly embedded in the pressure sensitive adhesive layer 25, as shown in FIG. 11, the devices 23 are stripped from the temporary adhesion layer 22, and the positions of the devices 23 on the transfer substrate 24 are held, with the devices 23 embedded in the pressure sensitive adhesive layer 25. In this case, where the materials for constituting the pressure sensitive adhesive layer 25 and the temporary adhesion layer 22 are so selected that the tack of the pressure sensitive adhesive layer 25 for holding the embedded devices 23 is greater than the tack of the temporary adhesion layer 22 for holding the devices 23, it is possible to strip the devices 23 from the temporary adhesion layer 22 and hold the devices 23 in the state of being embedded in the pressure sensitive adhesive layer 25, by only separating the temporary holding substrate 21 and the transfer substrate 24 away from each other. Also, a method may be adopted in which the material for constituting the temporary adhesion layer 22 or the pressure sensitive adhesive layer 25 is so selected that the tack thereof can be changed by an environmental change such as heating or irradiation with light and, after embedding the devices 23 in the pressure sensitive adhesive layer 25, the environmental change is effected so that the tack of the pressure sensitive adhesive layer 25 becomes greater than the tack of the temporary adhesion layer 22.

Since the devices 23 are stripped from the temporary adhesion layer 22 in the condition where the temporary adhesion layer 22 and the pressure sensitive adhesive layer 25 do not make contact with each other, the force required for separating the temporary holding substrate 21 and the transfer substrate 24 away from each other is reduced, and the possibility that the temporary holding substrate 21 or the transfer substrate 24 may be damaged at the time of stripping the devices 23 from the temporary adhesion layer 22 is lowered. Particularly, in the case of manufacturing a display apparatus having a large screen, it is necessary to enlarge the area of the transfer substrate 24 and, therefore, the lowering in the possibility of damaging of the transfer substrate 24 or the temporary holding substrate 21 promises a reduction in the manufacturing cost.

Figure 12:
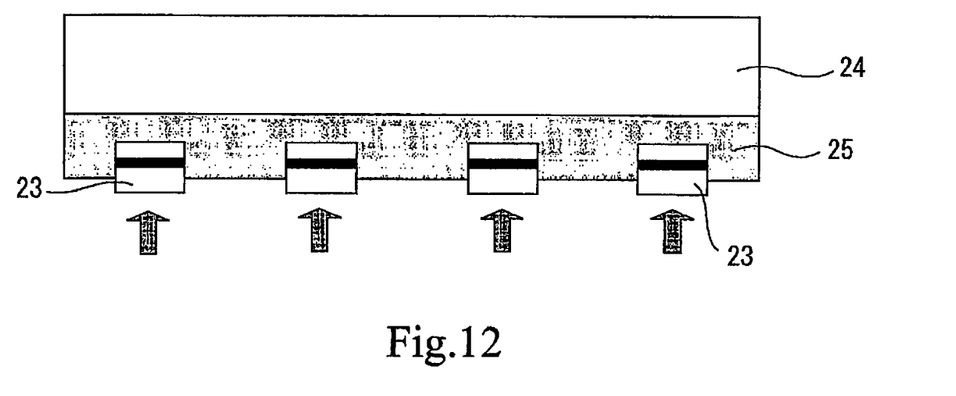
FIG. 12 is a step sectional view showing the manner in which the devices partly protruding from the pressure sensitive adhesive layer are embedded deeper into the pressure sensitive adhesive layer pursuant to an embodiment of the present invention.

Next, as shown in FIG. 12, the devices 23 partly embedded in the pressure sensitive adhesive layer 25 and partly protruding from the pressure sensitive adhesive layer 25 are embedded deeper into the pressure sensitive adhesive layer 25 by use of a roller or the like, whereby the devices 23 are embedded into the pressure sensitive adhesive layer 25 until the surfaces of the devices 23 and the pressure sensitive adhesive layer 25 become substantially flush with each other, and the devices 23 are held in the pressure sensitive adhesive layer 25.

Thereafter, in the same manner as in the first embodiment, in the condition where the devices 23 are held embedded in the pressure sensitive adhesive layer 25, an external cause for hardening (curing) the pressure sensitive adhesive layer 25, for example, a heating treatment or the like is applied to harden (cure) the pressure sensitive adhesive layer 25, electric wirings are formed on the pressure sensitive adhesive layer 25 and the devices 23, and a support substrate provided thereon with an adhesive layer is adhered to the pressure sensitive adhesive layer 25 so that the side, provided with the electric wirings, of the pressure sensitive adhesive layer 25 makes contact with the adhesive layer. After the support substrate is thus adhered, irradiation with laser beams is conducted to thereby strip the transfer substrate 24 from the pressure sensitive adhesive 25.

Subsequently, the hardened pressure sensitive adhesive layer 25 is provided with contact vias which are openings reaching the devices 23 by dry etching or the like, then the contact vias are filled with a metal and electric wirings are formed on the pressure sensitive adhesive layer 25. With the arrangements and electrically connected structures of the devices 23 and the electric wirings, it is possible to obtain a display apparatus for displaying images by simple matrix driving, in the same manner as in the first embodiment.

Next, a further embodiment of the present invention will be described below referring to the drawings. This embodiment is a device transfer method different from the above-described first embodiment in that the step of embedding devices into a pressure sensitive adhesive layer is repeated a number of times. The other steps are the same as in the first embodiment and, therefore, description thereof is omitted.

Figure 13:
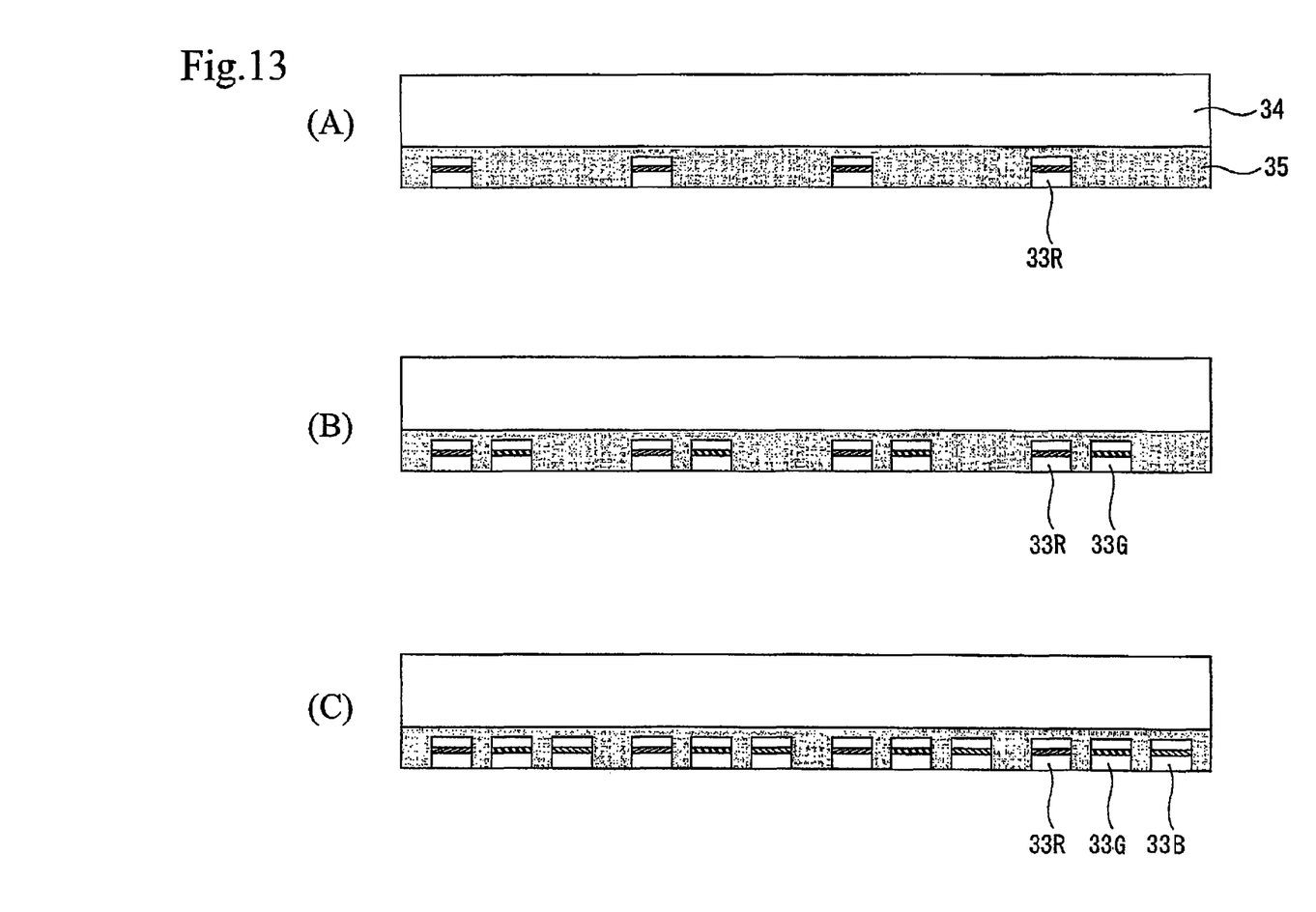
FIG. 13 shows step sectional views illustrating the manner in which devices having different characteristics are repeatedly embedded into the pressure sensitive adhesive layer in another embodiment of the present invention.

FIG. 13 illustrates the step of embedding devices 33R into a pressure sensitive adhesive layer 35 in this embodiment. The devices 33R are light-emitting diodes for emitting light in red color. The devices 33R are arranged on a temporary adhesion layer formed on a temporary holding substrate, a transfer substrate 34 provided thereon with a pressure sensitive adhesive layer 35 is disposed in parallel to the temporary holding substrate, and then the temporary holding substrate and the transfer substrate 34 are brought closer to each other, thereby embedding the devices 33R into the pressure sensitive adhesive layer 35. The devices 33R are stripped from the temporary adhesion layer so as to hold the positions of the devices 33R on the transfer substrate 34, with the devices 33R embedded in the pressure sensitive adhesive layer 35, as shown in FIG. 13(A).

Thereafter, as shown in FIG. 13(B), devices 33G which are light-emitting diodes for emitting light in green color are embedded at locations adjacent to the devices 33R by again following the procedure shown in FIGS. 1 to 4, and, thereafter, devices 33B which are light-emitting diodes for emitting light in blue color are further embedded at locations adjacent to the devices 33G.

After the plurality of kinds of devices are thus embedded in the pressure sensitive adhesive layer 35, in the condition where the devices 33R, 33G, 33B are held embedded in the pressure sensitive adhesive layer 35, an external cause for hardening (curing) the pressure sensitive adhesive layer 35, for example, a heating treatment or the like is applied to harden (cure) the pressure sensitive adhesive layer 35, electric wirings are formed on the pressure sensitive adhesive layer 35 and the devices 33, and a support substrate provided thereon with an adhesive layer is adhered to the pressure sensitive adhesive layer 35 so that the surface, provided thereon with the electric wirings, of the pressure sensitive adhesive layer 35 makes contact with the adhesive layer, in the same manner as in the first embodiment. After the support substrate is thus adhered, irradiation with laser beams is conducted so as thereby to strip the transfer substrate 34 from the pressure sensitive adhesive layer 35.

Next, the hardened pressure sensitive adhesive layer 35 is provided with contact vias which are openings reaching the devices 33 by dry etching or the like, then the contact vias are filled with a metal and electric wirings are formed on the pressure sensitive adhesive layer 35. With the arrangements and electrically connected structures of the devices 33R, 33G, 33R and the electric wirings, it is possible to obtain a display apparatus in which each pixel is composed of the devices for emitting light in red, green and blue colors.

The devices having different characteristics, generally, are difficult to form on the same growth substrate; therefore, it is difficult to arrange the devices having different characteristics on the temporary holding substrate and thereafter to embed the devices 33 into the pressure sensitive adhesive layer 35. The method in which the embedding of the devices 33 arranged on the temporary holding substrate into the pressure sensitive adhesive layer 35 is repeatedly carried out before the hardening of the pressure sensitive adhesive layer 35 facilitates the arrangement of the devices 33 having different characteristics into the same plane on the transfer substrate 34. In addition, the method in which the devices 33G differing in characteristics from the devices 33R are embedded into the pressure sensitive adhesive layer 35 in the condition where the devices 33R are embedded in the pressure sensitive adhesive layer 35 ensures that, in adjusting the positional relationship between the devices 33G arranged on the temporary holding substrate and the devices 33R embedded in the pressure sensitive adhesive layer 35, the arrangements can be prevented from being disordered due to interference between the devices 33G and the devices 33R.

Not only the light-emitting diodes but also light-receiving devices, driving circuit devices and the like can be used as the devices 33; therefore, arrangement of display devices and light-receiving devices in a mixed state in the same plane and arrangement of display devices and driving circuit devices in a mixed state in the same plane can be easily carried out.

A method in which the transfer of devices and the formation of electric wirings are conducted in the condition where a display device and a driving circuit device are mixedly present in each pixel makes it possible to obtain a display device of the active matrix driving type in which electric signals are sent to the driving circuit device and light emission on an pixel basis is controlled by the driving circuit devices.

Next, yet another embodiment of the present invention will be described below referring to the drawings. This embodiment is a device transfer method different from the above-described first embodiment in that the step of embedding of devices into a pressure sensitive adhesive layer is repeated a number of times. The other steps are the same as in the first embodiment and, therefore, description thereof is omitted.

Figure 14A:
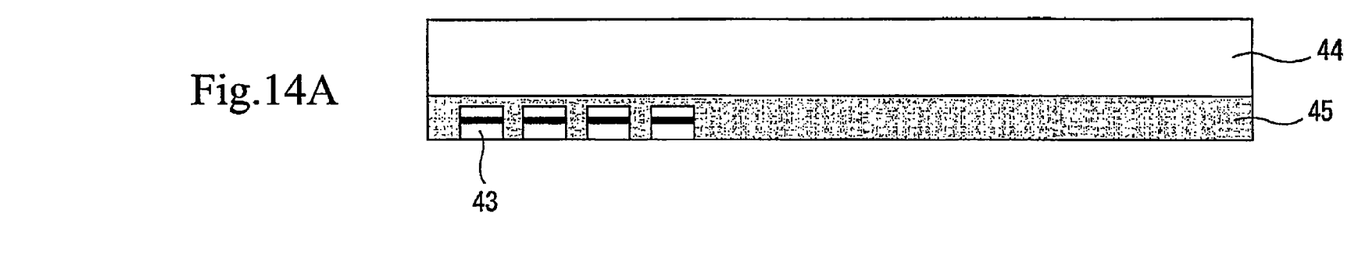
FIGS. 14A to 14C are step sectional views illustrating the manner in which, in the condition where devices have been embedded in the pressure sensitive adhesive layer, further devices are additionally embedded into the area where the devices have not yet been embedded of the pressure sensitive adhesive layer in a further embodiment of the present invention.
Figure 14B:
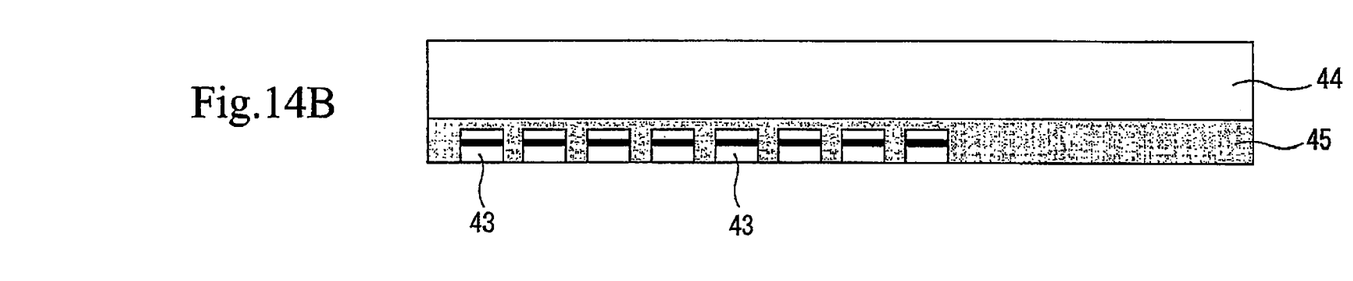
Figure 14C:
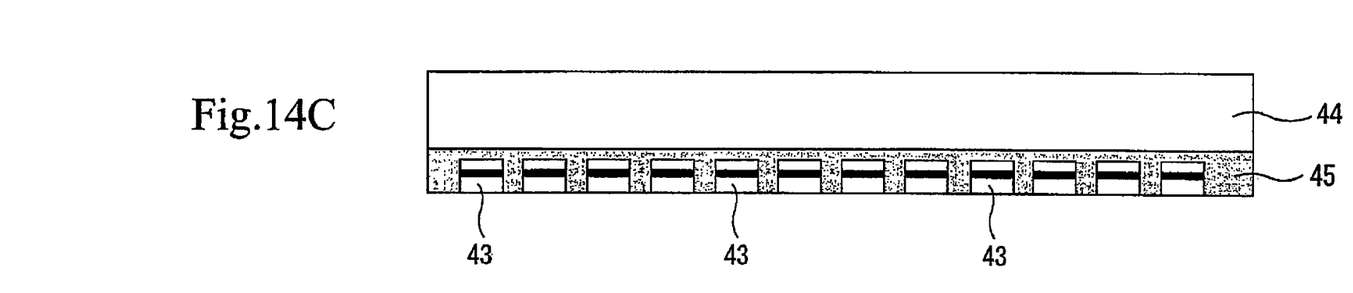

FIGS. 14A to 14C illustrate the steps of embedding devices 43 into a pressure sensitive adhesive layer 45 in this embodiment. The devices 43 are arranged on a temporary adhesion layer formed on a temporary holding substrate, a transfer substrate 44 provided thereon with a pressure sensitive adhesive layer 45 is disposed in parallel to the temporary holding substrate, and then the temporary holding substrate and the transfer substrate 44 are brought closer to each other, thereby embedding the devices 43 into the pressure sensitive adhesive layer 45. The devices 43 are stripped from the temporary adhesion layer so as to hold the positions of the devices 43 on the transfer substrate 44, with the devices 43 embedded in the pressure sensitive adhesive layer 45, as shown in FIG. 14A. In this case, the area where the devices 43 are embedded is a part of the whole area on the transfer substrate 44, so that there is left an area of the pressure sensitive adhesive layer 45 where the devices 43 have not yet been embedded.

Subsequently, as shown in FIGS. 14B and 14C, devices 43 are further additionally embedded into an area of the pressure sensitive adhesive layer 45 where the devices 43 have not yet been embedded. After the devices 43 are embedded into the pressure sensitive adhesive layer 45 in a plurality of batches, in the condition where the devices 43 are held embedded in the pressure sensitive adhesive layer 45, an external cause for hardening (curing) the pressure sensitive adhesive layer 45, for example, a heating treatment or the like is applied so as to harden (cure) the pressure sensitive adhesive layer 45, electric wirings are formed on the pressure sensitive adhesive layer 45 and the devices 43, and a support substrate provided thereon with an adhesive layer is adhered to the pressure sensitive adhesive layer 45 so that the surface, provided with the electric wirings, of the pressure sensitive adhesive layer 45 makes contact with the adhesive layer, in the same manner as in the first embodiment. After the support substrate is thus adhered, irradiation with laser beams is conducted so as thereby to strip the transfer substrate 44 from the pressure sensitive adhesive layer 45.

Next, the hardened pressure sensitive adhesive layer 45 is provided with contact vias which are openings reaching the devices 43 by dry etching or the like, then the contact vias are filled with a metal and electric wirings are formed on the pressure sensitive adhesive layer 45. With the arrangements and electrically connected structures of the devices 43 and the electric wirings, it is possible to obtain a display apparatus capable of displaying images by simple matrix driving.

The method in which devices 43 are further additionally embedded and held in an area on the transfer substrate 44 where the devices 43 have not yet been embedded, in the condition where the devices 43 are embedded in the pressure sensitive adhesive layer 45, makes it possible, even in the case where the area permitting the arrangement of the devices 43 on the temporary holding substrate is limited, to enlarge the area of the transfer substrate 44 and, hence, to arrange the devices on a substrate having a large area. This provides a device transfer method useful in the case of manufacturing a display apparatus having a large screen, particularly.

Since devices are stripped from a temporary adhesion layer before a pressure sensitive adhesive layer is hardened (cured) according to an embodiment, the force required for separating a temporary holding substrate and a transfer substrate away from each other is small, and the possibility that the temporary holding substrate or the transfer substrate may be damaged at the time of stripping the devices from the temporary adhesion layer is lowered. Particularly, in the case of manufacturing a display apparatus having a large screen, it is necessary to enlarge the area of the transfer substrate and, therefore, the lowering of the possibility of damaging the transfer substrate or the temporary holding substrate promises a reduction in the manufacturing cost.

With the devices differing in characteristics embedded into the pressure sensitive adhesive layer before the hardening (curing) of the pressure sensitive adhesive layer, it is possible to arrange and hold on the transfer substrate those devices which cannot be formed on the same growth substrate, and it is also possible to obtain a display apparatus for multicolor display by arranging light-emitting diodes for emitting light in different colors. In addition, it is possible to use not only light-emitting diodes but also light-emitting diodes and driving circuits as the devices.

By carrying out the transfer of devices and the formation of electric wirings in the condition where a display device and a driving circuit device are mixedly present in each pixel, it is also possible to obtain a display device of the active matrix driving type in which electric signals are sent to the driving circuit devices and light emission on a pixel basis is controlled by the driving circuit devices.

By further additionally embedding and holding devices in an area on the transfer substrate where the devices have not been embedded in the condition where the devices are embedded in the pressure sensitive adhesive layer, it is possible, even in the case where the area permitting the arrangement of the devices on the temporary holding substrate is limited, to enlarge the area of the transfer substrate and, hence, to arrange the devices on a substrate having a large area. This provides a device transfer method useful in the case of manufacturing a display apparatus having a large screen, particularly.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A device transfer method comprising:
arranging a plurality of first devices on a continuous temporary adhesion layer formed on a first substrate;
embedding the first devices arranged on the temporary adhesion layer of the first substrate into a pressure sensitive adhesive layer provided on a second substrate, wherein a plurality of second devices have been embedded into the pressure sensitive adhesive layer prior to embedding the first devices therein; and
stripping the first devices from the first substrate before hardening the entire pressure sensitive adhesive layer so as to hold the first devices in an embedded state in the pressure sensitive adhesive layer; and
hardening the entire pressure sensitive adhesive layer after the first devices are held along with the second devices in the embedded state in the pressure sensitive adhesive layer,
wherein the entire pressure sensitive adhesive layer remains uncured for successive device transfer steps, and
wherein for each embedding step, the first devices are transferred from the first substrate to the second substrate such that the just transferred first devices are spaced from each other with a pitch of the first devices on the second substrate that is at least substantially equal to a pitch of the first devices arrayed on the first substrate.

2. The device transfer method as set forth in claim 1, comprising forming first electric wirings on the pressure sensitive adhesive layer after the pressure sensitive adhesive layer is hardened.

3. The device transfer method as set forth in claim 2, comprising adhering a third substrate onto the side on which the first electric wirings are formed of the pressure sensitive adhesive layer after the first electric wirings are formed on the pressure sensitive adhesive layer.

4. The device transfer method as set forth in claim 3, comprising stripping the second substrate and the pressure sensitive adhesive layer from each other after the third substrate is adhered to the side on which the first electric wirings are formed of the pressure sensitive adhesive layer.

5. The device transfer method as set forth in claim 4, wherein the pressure sensitive adhesive layer is provided with openings reaching the first and second devices after the second substrate and the pressure sensitive adhesive layer are stripped from each other.

6. The device transfer method as set forth in claim 5, comprising filling the openings with a conductive material and forming second electric wirings on the pressure sensitive adhesive layer.

7. The device transfer method as set forth in claim 1, wherein a tack of the pressure sensitive adhesive layer provided on the second substrate is greater than a tack of the temporary adhesion layer provided on the first substrate.

8. The device transfer method as set forth in claim 7, wherein the tack any one of the pressure sensitive adhesive layer and the temporary adhesion layer is changed so that the tack of the pressure sensitive adhesive layer will be greater than the tack of the temporary adhesion layer.

9. The device transfer method as set forth in claim 1, wherein the embedding into the pressure sensitive adhesive layer provides the first and second devices in a partially embedded state.

10. The device transfer method as set forth in claim 1, wherein the pressure sensitive adhesive layer if formed of an insulating material.

11. The device transfer method as set forth in claim 1, wherein the first devices and the second devices have different characteristics.

* * * * *